United States Patent
Lee et al.

(10) Patent No.: US 9,536,712 B2
(45) Date of Patent: Jan. 3, 2017

(54) APPARATUS AND METHOD FOR MASS ANALYZED ION BEAM

(71) Applicant: Varian Semiconductor Equipment Associates, Inc., Gloucester, MA (US)

(72) Inventors: W. Davis Lee, Newburyport, MA (US); Svetlana Radovanov, Brookline, MA (US); Peter F. Kurunczi, Cambridge, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 453 days.

(21) Appl. No.: 14/299,681

(22) Filed: Jun. 9, 2014

(65) Prior Publication Data

US 2015/0357167 A1    Dec. 10, 2015

(51) Int. Cl.
*H01J 37/32* (2006.01)
*H01J 37/305* (2006.01)

(52) U.S. Cl.
CPC ........ *H01J 37/32678* (2013.01); *H01J 37/321* (2013.01); *H01J 37/32412* (2013.01); *H01J 37/32422* (2013.01); *H01J 37/3056* (2013.01); *H01J 37/32192* (2013.01)

(58) Field of Classification Search
CPC .... H01J 37/321; H01J 27/18; H01J 37/32412; H01J 37/32678; H01J 2237/006; H01J 2237/31701; H01J 37/32183; H01J 37/32422; H05H 13/00

USPC ............ 118/723 MA, 723 MR, 723 ME, 118/723 MW, 723 FI, 723 FE
IPC ............... H01J 37/32623, 37/32192, 37/32678, 37/3056

See application file for complete search history.

(56) References Cited

U.S. PATENT DOCUMENTS

| | | | | |
|---|---|---|---|---|
| 6,100,536 A | * | 8/2000 | Ito | H01J 37/026 250/251 |
| 6,335,535 B1 | * | 1/2002 | Miyake | H01J 37/32412 250/423 R |

\* cited by examiner

*Primary Examiner* — Tuyet Vo

(57) ABSTRACT

In one embodiment, a processing apparatus includes a plasma chamber configured to house a plasma comprising first ions and second ions. The apparatus may further include a resonance RF power supply to generate a drive signal that is coupled to the plasma chamber, the drive signal having a drive frequency. The apparatus may also include a magnet assembly to generate a magnetic field in the plasma chamber, wherein the magnet assembly is configured to generate a first magnetic field strength that imparts a first cyclotron frequency for the first ions that matches the drive frequency of the drive signal, wherein the first magnetic field strength imparts a second cyclotron frequency for the second ions that does not match the drive frequency of the drive signal, and wherein the first ions are selectively driven into a chamber wall of the plasma chamber.

20 Claims, 4 Drawing Sheets

APPARATUS AND METHOD FOR MASS ANALYZED ION BEAM

FIELD

The present embodiments relate to substrate processing, and more particularly, to processing apparatus for treating a substrate with ions.

BACKGROUND

Ion implantation for treating a substrate is often performed using a beamline ion implanter, which may include various components to shape an ion beam and control ion beam energy and species. In order to control purity of species to be implanted into a substrate mass resolution may be performed by components that provide magnetic or electrostatic deflection in order to filter out ions of an unwanted species. However, beamline ion implanters occupy a large footprint that imparts a relatively large cost for treatment of ions using a beamline ion implanter.

Alternatives to beamline ion implanters include more compact apparatus such as plasma doping (PLAD) apparatus or plasma immersion apparatus, in which a plasma chamber or arc chamber from which ions are directed to a substrate is placed adjacent a substrate chamber or forms the substrate processing chamber itself. Such apparatus provide the advantage of a smaller footprint and have fewer optical components than a conventional beamline ion implanter.

However, in this type of apparatus and other PLAD type apparatus the throw distance through which ions travel from plasma to substrate may be on the order of millimeters or a few centimeters. Accordingly, it may not be practical to introduce components to perform mass resolution of ions produced by the plasma before the ions impact the substrate. Thus, in these compact apparatus substrates are treated with ions that are not mass analyzed and may therefore include unwanted ion species. Accordingly, in present day plasma or ion beam processing technology a tradeoff exists between purity of ions in an ion beam as afforded by a beamline ion implanter and compactness, among other factors, which is afforded by apparatus in which the plasma or arc chamber is adjacent the substrate chamber.

It is with respect to these and other considerations that the present improvements have been needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment a processing apparatus includes a plasma chamber configured to house a plasma comprising first ions and second ions. The apparatus may further include a resonance RF power supply to generate a drive signal that is coupled to the plasma chamber, the drive signal having a drive frequency. The apparatus may also include a magnet assembly to generate a magnetic field in the plasma chamber, wherein the magnetic field has a magnetic field strength that imparts a first cyclotron frequency for the first ions that matches the drive frequency of the drive signal, and wherein the magnetic field strength imparts a second cyclotron frequency for the second ions that does not match the drive frequency of the drive signal. wherein the first ions are selectively driven into a chamber wall of the plasma chamber.

In another embodiment a processing apparatus may include a plasma chamber configured to house a plasma comprising first ions and second ions, a heating component to heat the plasma chamber, and a resonance RF power supply to generate a drive signal that is coupled to the plasma chamber, where the drive signal having a drive frequency. The apparatus may further include a magnet assembly to generate a magnetic field in the plasma chamber, wherein the magnetic field has a magnetic field strength that imparts a first cyclotron frequency for the first ions that matches the drive frequency of the drive signal, and wherein the first magnetic field strength imparts a second cyclotron frequency for the second ions that does not match the drive frequency of the drive signal, wherein the first ions are selectively driven into a chamber wall of the plasma chamber.

In a further embodiment, a method may include generating a magnetic field within in a plasma chamber containing a plasma comprising first ions and second ions, wherein the magnetic field imparts a first cyclotron frequency to the firsts ions and a second cyclotron frequency to the second ions. The method may further include generating a drive signal within the plasma chamber, the drive signal comprising electromagnetic radiation having a drive frequency that matches the first cyclotron frequency and does not match the second cyclotron frequency wherein the first ions are selectively driven into a chamber wall of the plasma chamber. The method may also include extracting a mass analyzed ion beam from the plasma chamber when the drive signal and magnetic field are within the plasma chamber, wherein the mass analyzed ion beam comprises a first ratio of second ions to first ions that is higher than a second ratio of second ions to first ions in the plasma.

DETAILED DESCRIPTION

The embodiments described herein provide apparatus, systems and methods to generate a mass analyzed ion beam. Various embodiments provide compact apparatus that generate a mass analyzed ion beam in equipment having the same or similar size to conventional PLAD tools or similar tools that are used to treat substrates with ions. The embodiments of the present disclosure may be employed to provide desired ions produced in a plasma chamber for ion implantation into a substrate in an adjacent substrate chamber, while screening out other unwanted ions from the plasma chamber without the use of mass analysis equipment between plasma chamber and process chamber. Accordingly, the overall size and footprint of a processing apparatus to generate an ion beam may be similar to conventional PLAD tools while still providing mass analysis of ions extracted from a plasma.

As disclosed herein the embodiments provide novel combinations of apparatus as well as methods to operate such apparatus for performing mass analysis in a compact processing system. The present embodiments may exploit the ion cyclotron resonance (ICR) phenomenon to prevent unwanted ions from being extracted from a plasma by driving the unwanted ions into a resonance condition. As detailed below, the present embodiments provide a magnet assembly and resonance RF apparatus that are used to perform mass analysis in a novel fashion. In particular, by appropriate spatial arrangement and control of settings of the magnet assembly and a resonance RF apparatus, unwanted ions, or first ions, which are generated within a plasma may be captured within ICR trajectories that prevent or reduce the likelihood of extraction of the unwanted ions from plasma. At the same time desired ions, or second ions, which are not captured in ICR trajectories, may be preferentially extracted from the plasma to form a mass analyzed ion beam that is depleted of the first ions. This results in the generation of a mass analyzed ion beam that has a first ratio of the second ions (target ions) to first ions (unwanted ions) that is higher than a second ratio of the second ions to first ions that is found in a plasma.

Figure 1A:
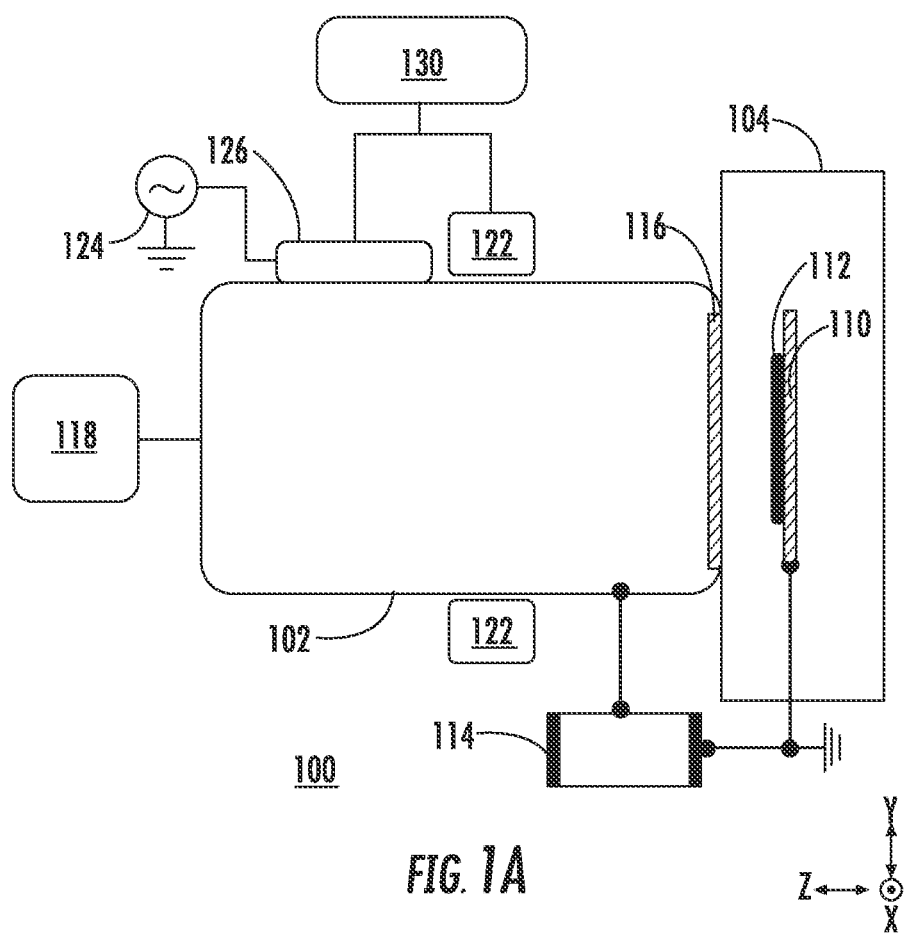
FIG. 1A depicts a processing apparatus according to embodiments of the present disclosure.
Figure 1B:
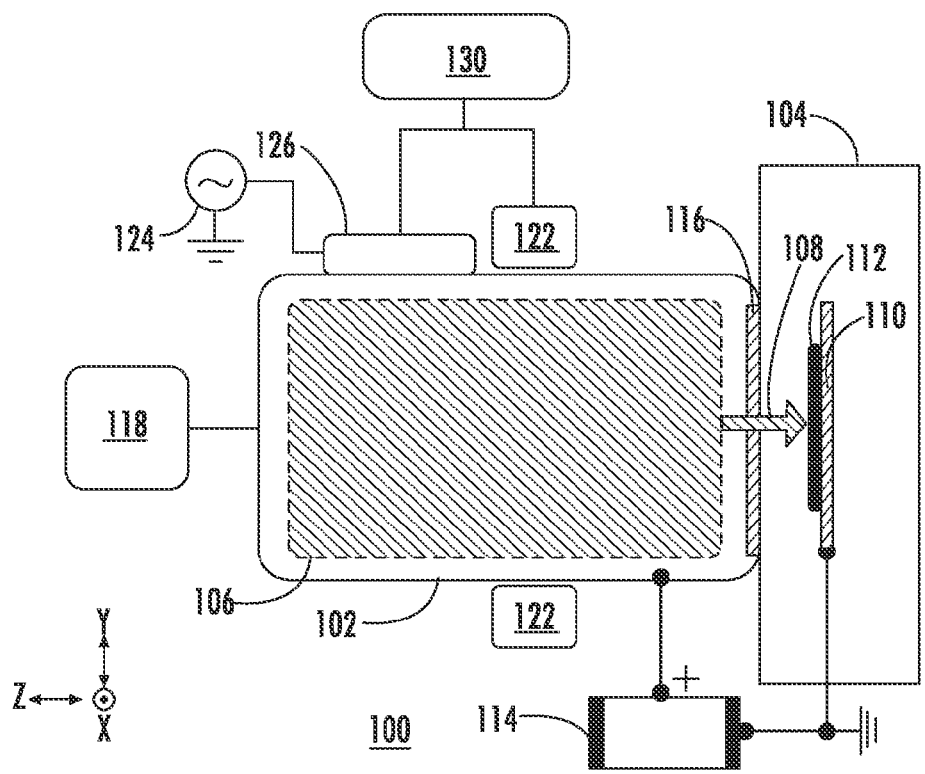
FIG. 1B and FIG. 1C depict details of operation of the processing apparatus of FIG. 1A.
Figure 1C:
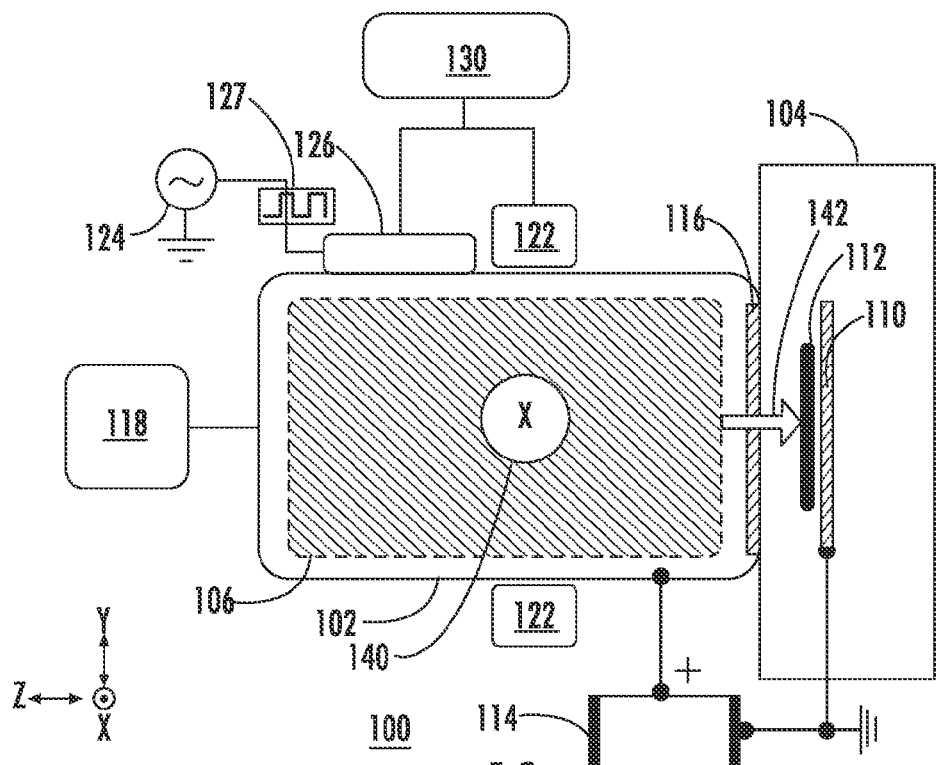
Figure 1D:
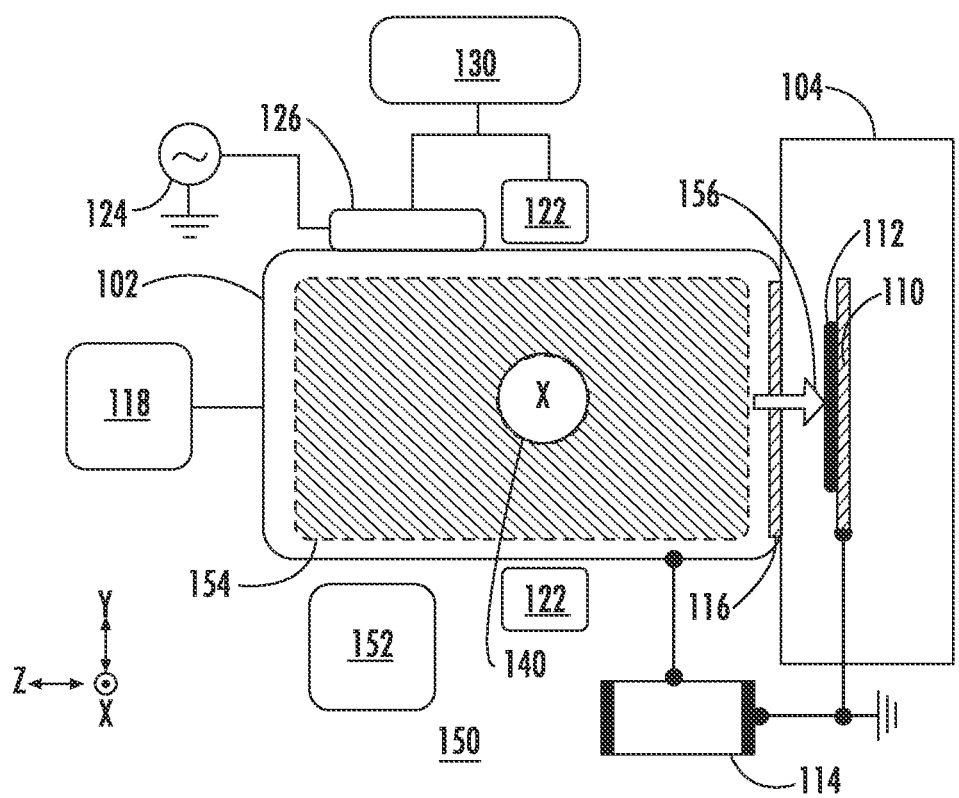
FIG. 1D depicts a variant of the processing apparatus of FIG. 1A.

FIG. 1A depicts a processing apparatus 100 according to embodiments of the present disclosure. FIG. 1B and FIG. 1C depict details of operation of the processing apparatus 100. FIG. 1D depicts a variant of the processing apparatus of FIG. 1A. As shown in FIG. 1A, the processing apparatus 100 includes a plasma chamber 102 and a process chamber 104 that is disposed adjacently to the plasma chamber 102. The processing apparatus 100 includes a plasma source 118 that is configured to provide input power to generate a plasma 106 in the plasma chamber 102, as shown in FIG. 1B. In various embodiments the plasma source 118 may include a plasma chamber power supply and applicator or electrode to generate a plasma according to known techniques. For example, the plasma source 118 may, in various embodiments, be an in situ source or remote source, an inductively coupled plasma source, capacitively coupled plasma source, helicon source, microwave source, arc source, or any other type of plasma source. The embodiments are not limited in this context.

The processing apparatus 100 may be used to direct ions to a substrate 112 that is supported by a substrate holder 110 located in the process chamber 104. As shown in FIG. 1A and FIG. 1B, the processing apparatus also includes a voltage supply 114 that is configured to apply a voltage between the plasma chamber 102 and substrate holder 110. In an example of generating a positive ion beam, when a plasma 106 is generated in the plasma chamber 102, and the plasma chamber 102 is placed at a plasma chamber voltage that is positive with respect to a substrate voltage that is applied to the substrate holder 110, positive ions may be extracted from the plasma 106 and attracted to the substrate 112. In particular, an extraction assembly 116 that is disposed between the plasma chamber 102 and process chamber 104 is provided to extract ions from the plasma 106. The extraction assembly 116 may include a single extraction electrode or multiple extraction electrodes and may be arranged according to known extraction apparatus. As illustrated in FIG. 1B an unanalyzed ion beam 108 may be extracted from the plasma 106 through the extraction assembly 116 and directed to the substrate 112.

In various embodiments the extraction assembly 116 may be configured to generate the unanalyzed ion beam 108 as a beam of ions having parallel trajectories, having diverging trajectories, or having converging trajectories. In some examples the unanalyzed ion beam 108 may comprise ions that have trajectories that are distributed over a range of angles of incidence with respect to the Z-axis of the Cartesian coordinate system shown. In particular examples the unanalyzed ion beam 108 may comprise ions whose trajectories exhibit a bimodal distribution of angles of incidence. The embodiments are not limited in this context.

In particular embodiments, the extraction assembly 116 may be composed of an extraction plate having an extraction aperture that is used to perturb or modify the shape of a plasma sheath boundary in order to control the shape or size of an ion beam, or to control ion trajectories of an ion beam that is directed to a substrate in the process chamber 104. In these embodiments the trajectories of ions may be controlled in a manner that directs ions to the substrate 112 over a range of angles of incidence with respect to a given direction, such as the Z-axis, including directing ions to a substrate having a bimodal distribution of angles of incidence. The embodiments, however, are not limited in this context.

The processing apparatus 100 also includes a magnet assembly 122, which may be composed of an electromagnet or a permanent magnet in different embodiments. As illustrated in FIG. 1C, the magnet assembly 122 is configured to generate a magnetic field 140 within the plasma chamber 102. In some embodiments, the magnetic field 140 may have a field direction that is parallel to a plane of an extraction plate (not separately shown) of the extraction assembly 116, such as along a direction parallel to the X-axis.

The processing apparatus 100 further includes a resonance RF power supply 124 that is coupled to an applicator 126, which is used to generate RF (radio frequency) electromagnetic radiation within the plasma chamber 102. In various embodiments, the applicator may have a known configuration such as a coil structure or a suitable antenna structure to generate RF radiation in an appropriate location and orientation within the plasma chamber 102 so as to interact with ions therein. A controller 130 may also be provided that is coupled to the magnet assembly 122 and resonance RF power supply 124. The controller 130 may adjust operation of the magnet assembly 122, the resonance RF power supply 124, or both, in order to generate a mass analyzed ion beam according to the procedures discussed below. The controller 130 may optionally be also coupled to the plasma source 118 in some embodiments.

As detailed below, the magnet assembly 122 and a resonance RF power supply, such as resonance RF power supply 124, are interoperative to establish a mass analysis mode or operating condition. This mass analysis mode is used to drive certain, unwanted, ions that may be present within the plasma 106 into ion cyclotron resonance (ICR) trajectories that act to prevent those ions from exiting the plasma chamber 102. This has the beneficial effect of selectively favoring other, non-resonant ions for extraction from a plasma such as the plasma 106, while disfavoring the unwanted ions from extraction from the plasma 106.

To illustrate this point FIG. 1B presents one example of operation of the processing apparatus 100 in a conventional mode. In this mode, the resonance RF power supply 124, magnet assembly 122, or both, may be inactive or operating under conditions that do not generate an ICR condition for ions in the plasma 106. In this conventional mode, positive ions that drift to the edge of the plasma 106 may be accelerated and extracted through the extraction assembly 116, forming the unanalyzed ion beam 108, which impacts the substrate 112. In one example, the plasma 106 may be employed to provide dopants or other desired species to the substrate 112, which may be implanted into the substrate 112 or deposited on the substrate 112 when a desired voltage is established between the plasma chamber 102 and substrate holder 110 using the voltage supply 114.

However, plasma 106 may additionally contain unwanted ions, such as ions that are created from the same precursors that are used to generate dopants for implantation or other desired ion species for condensing on the substrate 112. For many common dopant precursor molecules that are used to generate ions for implanting into semiconductor substrates, the precursor molecules generally may contain at least one atom of the dopant element that is desired for implantation, and may additionally contain multiple atoms of a different element, such as hydrogen. Examples of such dopant precursor molecules include $PH_3$, $AsH_3$, $BF_3$, $B_2H_6$, which are used to implant phosphorous, arsenic, or boron. In addition, the plasma 106 may be used to provide other desired species to the substrate including silicon, germanium, nitrogen, or antimony, which may be provided using hydride precursor molecules, such as $SiH_4$, $GeH_4$, $NH_3$, and $SbH_3$, respectively.

When the plasma 106 is established and includes any of the aforementioned precursor molecules or other precursors, these precursor molecules may be broken up into other species including atoms, radicals, and molecular fragments, which may be ionized and extracted from the plasma chamber 102 to form the unanalyzed ion beam 108. The unanalyzed ion beam 108 may therefore contain unwanted ions, such as hydrogen ions or fluorine ions, in addition to desired ions.

In circumstances in which it is desirable to prevent unwanted ions from being extracted from the plasma 106, the processing apparatus 100 may be operated in a second mode, a mass analysis mode, by appropriate operation of the magnet assembly 122 and resonance RF power supply 124. FIG. 1C presents one example of operation of the apparatus 100 in a mass analysis mode. In this mode, the resonance RF power supply 124 and magnet assembly 122 are operated in a manner that reduces the likelihood of extraction of ions of a given (unwanted) species from the plasma 106 by driving the ions of the given species into ion cyclotron resonance, as detailed below with respect to FIG. 2. As shown in FIG. 1C, a magnetic field 140 is generated within the plasma chamber 102. In this example the magnetic field 140 is directed along a direction parallel to the X-axis, but other orientations of a magnetic field are possible. As explained below, in the presence of the magnetic field 140 the resonance RF power supply 124 may be employed to drive unwanted ions in the plasma 106 into ion cyclotron resonance at resonance cyclotron frequency characteristic of the unwanted ions. In particular, the resonance RF power supply 124 may supply a drive signal 127 at a drive frequency that matches the cyclotron frequency of unwanted ions, which frequency is characteristic of the mass and charge of the unwanted ions. Unless otherwise noted, in reference to the embodiments discussed herein for simplicity it may be assumed that ions carry a single positive charge. However, the embodiments are not limited in this context.

As discussed in more detail below, once in an ion cyclotron resonance condition, the unwanted ions may travel along spiral trajectories that result in directing the unwanted ions to walls of the plasma chamber 102, thus preventing their extraction into an ion beam that is directed to the substrate 112. In the example of FIG. 1C a mass analyzed ion beam 142 that is depleted of unwanted ions may thus be directed to the substrate 112.

Figure 2:
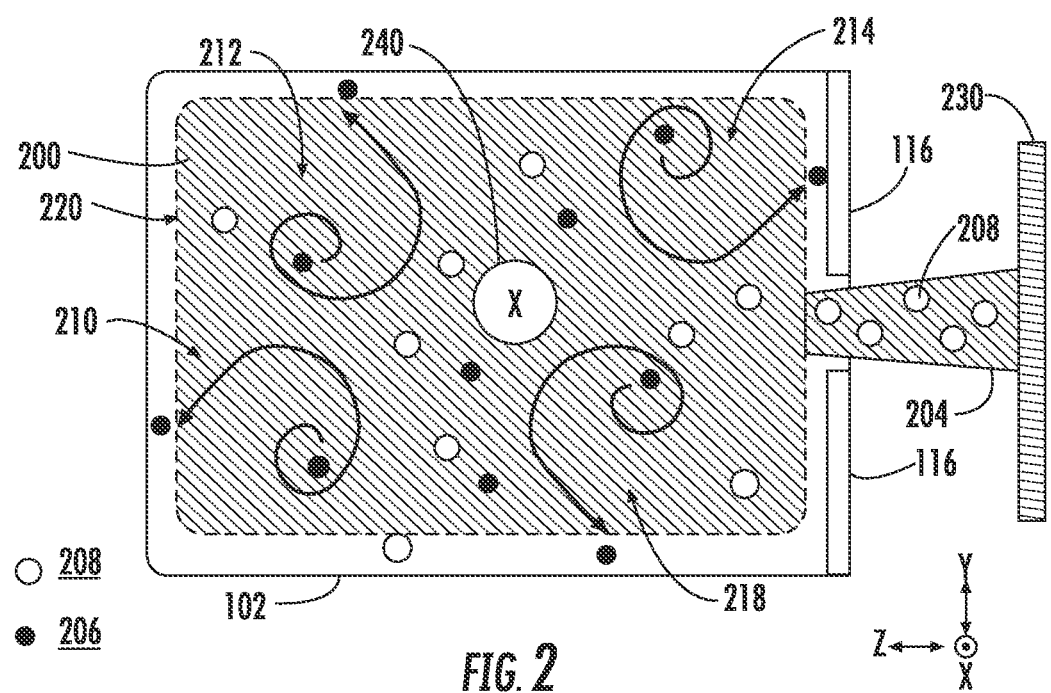
FIG. 2 depicts a schematic representation of operation of mass resolution using ion cyclotron resonance in accordance with embodiments of the disclosure.

FIG. 2 depicts a schematic representation of operation of mass resolution (mass analysis) using ion cyclotron resonance in accordance with embodiments of the disclosure. In FIG. 2 there is shown one instance of operation of the plasma chamber 102 with various additional components of the processing apparatus 100 omitted for clarity. In this scenario a plasma 200 is established within the plasma chamber 102. The plasma 200 may be generated by known techniques such as those disclosed above. In this example the plasma 200 includes first ions 206 and second ions 208. The first ions 206 and second ions 208 may represent products that are derived from a common molecular precursor such as $PH_3$, $AsH_3$, $BF_3$, $B_2H_6$, $SiH_4$, $GeH_4$, $NH_3$, and $SbH_3$, or other molecule. For example, the first ions 206 may be $H^+$, $H_2^+$ or $H_3^+$, which are derived from a precursor molecule that includes target species that are to be directed to a substrate 230. The second ions 208 may be, for example, ions that contain phosphorous, arsenic, boron, silicon, germanium, nitrogen, antimony, and so forth. The second ions 208 may be depleted of hydrogen with respect to a precursor molecule used to form the second ions.

In one example, the second ions 208 may be composed of $B^+$ that is derived from $BF_3$. It may be desirable to implant just boron into the substrate 230 without implanting hydrogen. Accordingly, in the scenario of FIG. 2 a magnetic field 240 is applied that extends along a direction parallel to the X-axis within the plasma chamber 102. In order to prevent the first ions 206 from exiting the plasma chamber 102, this magnetic field may be used to drive the first ions 206 into resonance at their cyclotron frequency as explained below.

In the presence of a magnetic field, moving charged particles such as ions tend to gyrate around the magnetic lines of force, which is represented by the magnetic field 240 in FIG. 2. This is a consequence of the Lorentz force that is established as given by $$m\frac{dv}{dt} = qv + B \quad (1)$$

where m is the mass of the charged particle, dv/dt is the derivative of the velocity with respect to time, q is the charge of the particle, v is the velocity of the particle and B is the magnetic field, or magnetic field strength. From Eq. (1), the frequency of gyration $\Omega_C$ may be determined as:

$$\Omega_C = \frac{q|B|}{m} \quad (2)$$

The radius of the gyro-orbit is known as the Larmor radius, $\rho_L$, and depends on the frequency of gyration $\Omega_C$ and the particle velocity perpendicular to the magnetic field. In particular, the Larmor radius is given by:

$$\rho_L = \frac{v_\perp}{\Omega_C} = \frac{mv_\perp}{qB} \quad (3)$$

where $v_\perp$ is the velocity of the charged particle or ion in a direction perpendicular to the magnetic field. This velocity may be a component of the thermal velocity of an ion having an initially random trajectory within plasma, or this velocity may be imparted into an ion in the plasma by another means.

Thus, according to Eq. (2) for a given ion having a mass m a magnet assembly may be employed to set a magnetic field strength that imparts or sets the frequency of gyration ($\Omega_C$) for the given ion, which is referred to herein as the "cyclotron frequency" for the given ion. Furthermore, in the presence of the magnetic field, charged particles such as ions can be made to resonate at their cyclotron frequency. This resonance may be accomplished by driving the ions using electromagnetic radiation that is termed herein a "drive signal," where the drive signal is generated at a frequency that is the same as the cyclotron frequency of the ions, or is a harmonic of the cyclotron frequency of the ions. This frequency of an electromagnetic signal is referred to herein as a "drive frequency" and may be employed in the present embodiments by a resonance RF power supply to generate a drive signal having a drive frequency that matches the cyclotron frequency of a given ion species to be captured, such as first ions 206. This may lead to an ion cyclotron resonance for the first ions 206 that imparts a large energy to the first ions 206 and causes the radius of gyration for the first ions 206 to increase as the ion's tangential velocity grows while the ion cyclotron (gyration) frequency remains the same.

As shown in FIG. 2, a consequence of this increase in radius of gyration is that the first ions 206 may be driven into ion trajectories in the plasma chamber 102 that spiral outward as a function of time. This is illustrated by an ion trajectory 210, ion trajectory 212, ion trajectory 214, and ion trajectory 216. These ion trajectories are illustrative in a schematic fashion of ion trajectories that may be experienced by ions driven into ion cyclotron resonance. Eventually, the ion trajectories followed by first ions 206 may cause the first ions 206 to reach the plasma sheath boundary 220, at which point the first ions may be accelerated to the wall of the plasma chamber 102 and captured by the plasma chamber, thus preventing their exit from the plasma chamber 102.

Other ions whose mass is different from that of the first ions have a cyclotron frequency that differs from that of the first ions. Accordingly, when a drive signal is applied to the plasma chamber 102 whose frequency matches the cyclotron frequency of the first ions 206, these other ions, as represented by second ions 208, are not driven into an ion cyclotron resonance condition. These other ions, such as second ions 208, may also gyrate in response to the magnetic field B at a cyclotron frequency characteristic of the second ions 208. However, because the cyclotron frequency of the second ions 208 does not match the drive frequency of the drive signal applied by the resonance RF power supply, the second ions 208 may assume trajectories that have a fixed Larmor radius that is determined by ion mass and velocity of the second ions 208 in a direction perpendicular to the magnetic field 240, as specified in Eq. (3). Accordingly, the trajectories of second ions 208 may not drive the second ions 208 into the walls of the plasma chamber 102. In this manner, a relatively higher fraction of second ions 208 may reach the plasma sheath boundary 220 adjacent the extraction assembly 116, such that the composition of the ion beam 204 that is extracted from plasma 200 may have a ratio of second ions 208 to first ions 206 that is higher than the ratio of second ions 208 to first ions 206 in the plasma 200, since at least some of the first ions 206 are selectively collected by a chamber wall of the plasma chamber 102. In other words, in comparison to second ions 208, the first ions 206 are selectively driven into a chamber wall of the plasma chamber 102 or chamber walls of the plasma chamber 102 by establishing the ion cyclotron resonance condition for the first ions 206 that causes the first ions to spiral outwardly until colliding with the plasma chamber 102.

As may be understood from the above discussion those ions that are driven into ion cyclotron resonance have a cyclotron frequency or a harmonic of the cyclotron frequency that is the same as the drive frequency supplied by the resonance RF power supply. In turn, as shown by Eq. (2), leaving aside particle charge q, the cyclotron frequency for a given ion is dependent just on mass of the ion m for a given magnetic field B, which is used herein to denote magnetic field strength along a particular direction Thus, in the example of FIG. 2, in order to filter out first ions 206 a drive signal for a resonance RF power supply is supplied at a drive frequency that matches the cyclotron frequency for ions having the mass of the first ions 206 when subject to the magnetic field B.

In the example in which the first ions 206 are hydrogen ($H^+$), the first ions 206 may be filtered, that is, driven to a wall or walls of plasma chamber 102, over a range of drive frequency and magnetic field (strength) that is conveniently accessible by common apparatus. For example, in different embodiments drive frequencies may be 20 MHz or less, and may span a range of 30 kHz to 20 MHz in some examples. The magnetic field strengths in turn may vary between 20 Gauss and 660 Gauss to establish an ion cyclotron resonance for $H^+$ in the plasma 200 that is effective to capture the $H^+$ in outwardly spiraling trajectories. In one specific example, a 400 kHz drive signal may be supplied by a resonance RF power supply to the plasma chamber 102, while a 262 Gauss field is generated in the plasma 200, which is effective to establish an ion cyclotron resonance condition for $H^+$. It may be assumed that the gas pressure in plasma chamber 102 is 5 mTorr, which corresponds to a mean free path of approximately 12 cm for hydrogen. If it is further assumed that ions 206 have an initial ion temperature of 0.8 eV, this implies a thermal velocity for ions 206 of approximately $1.2 \times 10^4$ m/s, resulting in a Larmor radius of 3.1 cm. If a 400 kHz drive signal is applied at 100 W this may generate an electric field on the order of 0.9 V/m. Under this set of conditions, the elapsed time that is expended by an ion to drive that ion into a chamber wall can be estimated, which is proportional to the size of the plasma chamber 102. For example, if the plasma chamber 102 has a square configuration that is 10 cm on a side, once the radius of an outwardly spiraling ion trajectory of an ion of first ions 206 reaches approximately 5 cm, the ion of first ions 206 can be expected to strike the plasma chamber 102. Under the above conditions the calculated elapsed time for a $H^+$ ion to achieve 5 cm gyro radius is 0.09 mili-seconds. Thus, when a given $H^+$ ion is generated and begins to resonate in the magnetic field in response to an applied resonance RF signal, the given $H^+$ ion may strike the chamber wall of a 5 cm chamber within approximately 90 microseconds.

In other examples the drive frequency and magnetic field strength may be set at other values to drive a given ion species into ion cyclotron resonance. The elapsed time that an ion spends in a resonance condition before striking the walls of a chamber, termed "resonance duration" herein, may be reduced, for example, by increasing the drive frequency. Continuing with the example of $H^+$ ions, a drive frequency of 600 kHz may be applied to a plasma that is subject to a magnetic field of 393 Gauss in order to drive $H^+$ ions into ion cyclotron resonance. When the RF power is maintained at a constant level as frequency is increased, this increase in drive frequency leads to a higher electric field strength, which causes a more rapid increase in radius of gyration of the $H^+$ ions that absorb the higher frequency radiation, thus reducing resonance duration.

In various embodiments, a controller such as controller 130 may be coupled to a magnet assembly and resonance RF power supply to increase drive frequency of an RF drive signal and magnetic field strength in concert so that an increased magnetic field strength imparts a cyclotron frequency for a given species of ions that matches the increased drive frequency of the drive signal, which thus maintains the ions in a resonance condition. In addition to varying resonance duration of given ions, the changing of magnetic field and drive signal in concert can change initial Larmor radius, which may be useful to match to chamber dimensions. However, although increasing magnetic field strength may reduce resonance duration, the higher strength magnetic field used at the higher drive frequency to meet the condition for ion cyclotron resonance may be more difficult to generate by a magnet assembly and more difficult to maintain over a larger volume.

Returning now to FIG. 1C, in different embodiments a drive signal supplied by a resonance RF power supply 124 may be applied in different manners to couple to the magnetic field 140 in order to provide mass analysis to given ions to be filtered from the plasma 106. In one example, the applicator 126 may launch a drive signal into the plasma chamber 102 that is composed of circularly polarized RF radiation that propagates along a direction parallel to the magnetic field 140, that is, along the X-direction. In circularly polarized electromagnetic radiation, the mutually perpendicular electric field and magnetic field that make up the electromagnetic radiation precess around the propagation direction of the electromagnetic radiation. This type of motion of the electric field allows the circularly polarized RF radiation to continuously couple to the ions whose cyclotron frequency matches the frequency of the drive signal. In other words, since the magnetic field induces circular gyration of the resonant ions at the same frequency as the circularly polarized RF radiation, the gyrating ion may experience a constant accelerating (or decelerating) electric field from the circularly polarized RF radiation.

In other embodiments a linearly polarized RF radiation may be launched by the applicator 126. However, in linearly polarized electromagnetic radiation, the relative position of the electric field may remain fixed such that a gyrating ion may couple to the electric field of the linearly polarized electromagnetic radiation just during portions of a cycle in which the ion trajectory aligns with the electric field.

In additional embodiments, a processing apparatus may be operated in a hot condition in conjunction with the use of ion cyclotron resonance in order to improve mass analysis capability of a processing apparatus. Turning now to FIG. 1D there is shown a processing apparatus 150 which may include similar or the same components as processing apparatus 100. The processing apparatus 150 additionally includes a heating component 152, which may be implemented in any convenient manner to heat at least a portion of the processing apparatus 150, such as a gas supply system (not shown) or the plasma chamber 102. For example a gas source (not shown) or the plasma chamber 102 or both may be heated to elevated temperature such as above 200° C., or above 300° C., during generation of a plasma 154. This may result in extraction of an ion beam 156 that has fewer unwanted ions in comparison to an ion beam extracted from an unheated processing apparatus, as discussed below.

As noted under many circumstances a molecular precursor for ions to be delivered to a substrate may include unwanted species such as hydrogen, or other species such as carbon or fluorine. When a plasma is formed, the molecular precursors may be decomposed or "fractionated" into other molecular or atomic species, some of which may constitute the unwanted species to be removed such as hydrogen. The present embodiments provide mass analysis by driving unwanted, target ions that may form, for example, from atomic hydrogen into any ion cyclotron resonance condition to direct those target ions to a plasma chamber wall. However, depending upon the degree of fractionation of species in the plasma, the plasma may include hydrogen-containing species whose cyclotron frequency does not match the frequency of a drive signal and therefore are not driven into an ion cyclotron resonance condition that can direct them to a plasma chamber wall. These additional hydrogen-containing species may therefore be extracted along with desired species into an ion beam that is directed to a substrate.

In the case of ion implantation of phosphorous using $PH_3$ as a precursor, in addition to $PH_3$ itself, ions may be generated in a plasma from many different species that are formed as decomposition products from the precursor $PH_3$ molecule. These species include $PH_2$, PH, P, $H_3$, $H_2$, and H. Of these species, it may be desirable to provide just P in an ion beam to be directed to a substrate. Accordingly, in embodiments in which the appropriate parts of a processing apparatus are heated to above 200° C., for example, the fraction of molecular species in a plasma 154 that are either P or H may be increased in comparison to plasma 106 when the processing apparatus 100 is operated in an unheated condition. In some instances the majority of ions, such as 90% of ions generated in such a plasma, are either $H^+$ or $P^+$. Accordingly, the unwanted $H^+$ ions may be driven to walls of the plasma chamber, while the remaining ions, which are predominantly $P^+$ are extracted in the ion beam 156.

Figure 3:
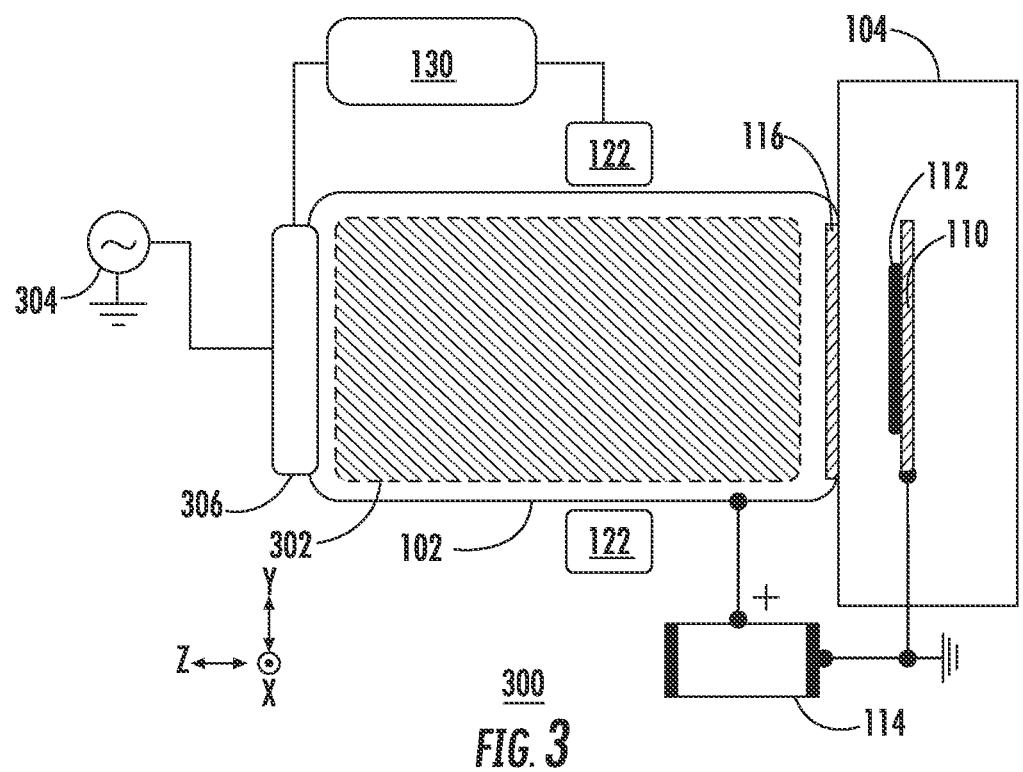
FIG. 3 illustrates a processing apparatus that has a dual purpose RF power supply according to embodiments of the disclosure.

In additional embodiments a single RF power supply may be used to both generate a plasma in a plasma chamber and to generate radiation of appropriate frequency for driving unwanted ions into an ion cyclotron resonance condition that results in directing the unwanted ions to the walls of the plasma chamber. FIG. 3 illustrates a processing apparatus 300 that has a dual purpose RF power supply 304 coupled to an applicator 306. The dual purpose RF power supply 304 may be configured to generate an RF power signal of appropriate power level and frequency to ignite and sustain a plasma 302 within the plasma chamber 102. The dual purpose RF power supply 304 may be further configured to generate the RF power signal at a drive frequency that matches a cyclotron frequency of target ions that may be generated in the plasma 302. This embodiment has the advantage that two separate RF power supplies are not necessary for operation to both generate a plasma and perform mass analysis. Another advantage is that since no separate resonance RF power supply is used to generate a drive signal to perform mass analysis, there is no separate RF drive signal to account for whose presence may perturb an RF power signal that generates the plasma 302. However, the power imparted into a drive signal to perform mass resolution (analysis) is not independently variable with respect to the power to generate the plasma 302, since just a single RF signal is generated to perform both functions.

Figure 4:
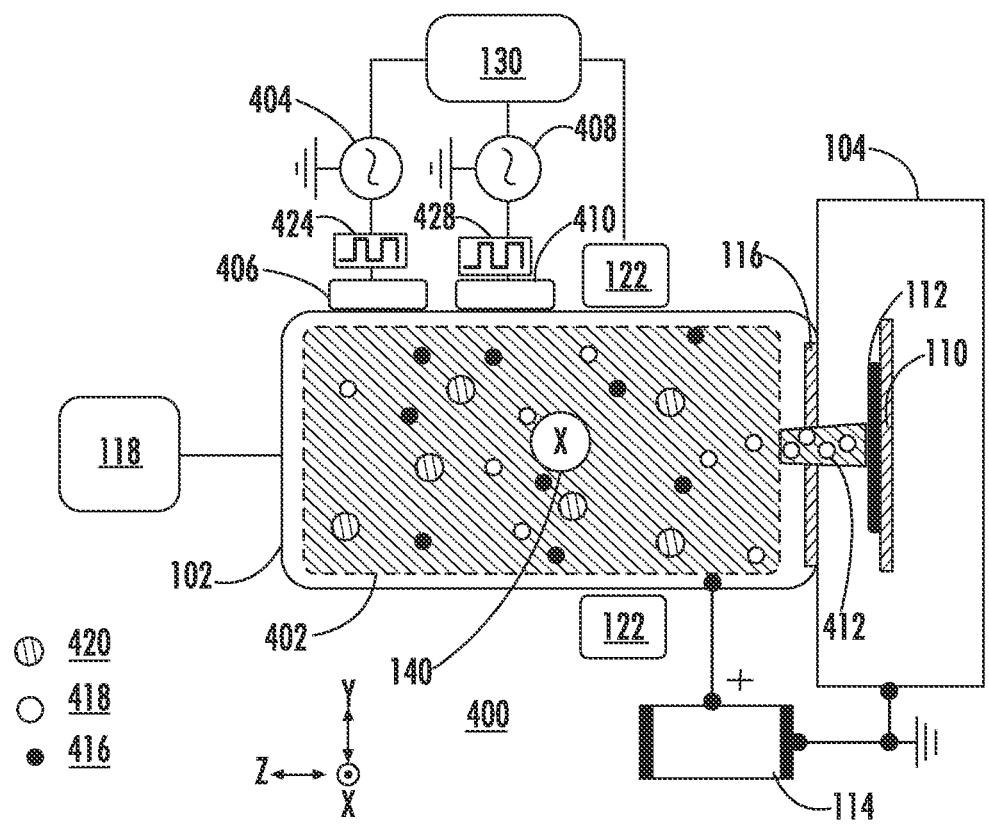
FIG. 4 depicts an embodiment of a processing system that includes a plurality of resonance RF power supplies according to further embodiments.

FIG. 4 depicts an embodiment of a processing apparatus 400 that includes a plurality of resonance RF power supplies in addition to the plasma source 118, which may be employed to generate the plasma 402. A first resonance RF power supply 404 is coupled to an applicator 406 and a second resonance RF power supply 408 is coupled to an applicator 410. Operation of each of these resonance RF power supplies and applicators may be similar to that described above with respect to FIGS. 1A-2. In brief, each resonance RF power supply of processing apparatus 400 may generate a drive signal that is used to drive target ions that may be formed in plasma 402 and are to be prevented from exiting the plasma chamber 102 in the ion beam 412. In the example of FIG. 4 the first resonance RF power supply 404 may generate a first drive signal 424 having a first drive frequency that matches a first cyclotron frequency of first ions 416, and thus drives the first ions 416 into an ion cyclotron resonance condition. This may result in directing the first ions 416 to the walls of the plasma chamber 102, and thus preventing the first ions 416 from exiting the plasma chamber 102 in the ion beam 412. At the same time the second ions 418 may have a second cyclotron frequency that does not match the first drive frequency. Additionally, the second resonance RF power supply 408 may generate a second drive signal 428 having a second drive frequency different from the first drive frequency that matches a third cyclotron frequency of third ions 420, and thus drives the third ions 420 into an ion cyclotron resonance condition. This may result in directing the third ions 420 to the walls of the plasma chamber 102, and thus preventing the third ions 420 from exiting the plasma chamber 102 in the ion beam 412. At the same time the second cyclotron frequency of the second ions 418 may not match the third drive frequency. In this manner, the second ions 418 may not be driven into an ion cyclotron resonance condition and therefore may not be prevented from exiting the plasma chamber in the ion beam 412. Thus, both the first ions 416 and third ions 420 may be selectively driven into a chamber wall of the plasma chamber 102 with respect to the second ions 418. This may result in the ion beam 412 being enriched in second ions 418 with respect to the concentration of second ions 418 in the plasma 402. Thus, a first ratio of second ions 418 to first ions 416 in the ion beam 412 may be higher than a second ratio of second ions 418 to first ions 416 in the plasma 402. Likewise, a third ratio of second ions 418 to third ions 420 in the ion beam 412 may be higher than a fourth ratio of second ions 418 to third ions 420 in the plasma 402.

In some scenarios, the processing apparatus 400 may be employed to mass analyze multiple different ions simultaneously, such as hydrogen ions and carbon ions. In other scenarios, the processing apparatus 400 may be employed to mass analyze different ions in a sequential fashion. For example, during a first instance the first resonance RF power supply 404 may generate a first drive signal at a first drive frequency to drive a first ion species into ion cyclotron resonance to filter out that first ion species during a first ion implantation process to implant a first implant species. Subsequently, during a second ion implantation process to implant a second implant species the second resonance RF power supply 408 may generate a second drive signal at a second drive frequency to drive a second ion species into ion cyclotron resonance to filter out that second ion species.

In some examples a controller 130 may be employed to coordinate operation of the first resonance RF power supply 404, second resonance RF power supply 408, and magnet assembly 122 in order to control sequential or simultaneous mass analysis of different ion species using different drive signals at different drive frequencies. The controller 130 may, for example, send signals to switch from an ON state to an OFF state the first resonance RF power supply 404 or second resonance RF power supply 408, or to adjust frequency of a drive signal to either resonance RF power supply. In additional scenarios, this switching may be performed to dynamically adjust mass analysis of an ion beam extracted from a plasma. For example, a resonance RF power supply may be switched between an ON or OFF state to switch between generating an analyzed ion beam that is depleted of an unwanted species generated in the plasma 402, and an unanalyzed ion beam that includes the "unwanted" species.

Although the aforementioned embodiments have described examples in which a drive frequency is used to match a cyclotron frequency of a target ion species, it can be expected that application of a given drive frequency may also drive additional ion species into ion cyclotron resonance under some circumstances. For example, if a drive signal at a first drive frequency is launched into a plasma chamber 102 containing hydrogen ions where the first drive frequency matches the cyclotron frequency of $H^+$ ions, the $H^+$ ions may be driven into ion cyclotron resonance due to coupling to the drive signal frequency as described above. In addition, $H_2^+$ ions that may be present due to incomplete fractionation may be driven into ion cyclotron resonance. This can be understood from the following relationship:

$$f_c = \frac{qB}{2\pi m}, \qquad (4)$$

which illustrates the relationship of (non-angular) cyclotron frequency $f_c$ to mass of an ion m. Thus, $H_2^+$ ions exhibit a cyclotron frequency that is half that of monatomic hydrogen ions for a given magnetic field strength. These $H_2^+$ may therefore be driven into resonance by the drive signal when a frequency of the drive signal matches the cyclotron frequency of $H^+$ ions, since in accordance with Eq. (4) that frequency is double the cyclotron frequency of $H_2^+$ ions and is therefore a second harmonic of the cyclotron frequency of $H_2^+$ ions. Similarly, $H_3^+$ ions may therefore be driven into resonance by a the same drive signal whose drive frequency matches the cyclotron frequency of the $H^+$ ions, since that drive frequency represents the third harmonic of the cyclotron frequency of $H_3^+$ ions.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A processing apparatus, comprising:
a plasma chamber configured to house a plasma comprising first ions and second ions;
a resonance RF power supply to generate a drive signal that is coupled to the plasma chamber, the drive signal having a drive frequency; and a magnet assembly to generate a magnetic field in the plasma chamber,
wherein the magnetic field has a first magnetic field strength that imparts a first cyclotron frequency for the first ions that matches the drive frequency of the drive signal,
wherein the first magnetic field strength imparts a second cyclotron frequency for the second ions that does not match the drive frequency of the drive signal, and
wherein the first ions are selectively driven into a chamber wall of the plasma chamber.

2. The processing apparatus of claim 1, wherein the drive signal generates an ion cyclotron resonance in the first ions that increases a Larmor radius of the first ions, wherein the first ions collide with a chamber wall of the plasma chamber.

3. The processing apparatus of claim 1, wherein the first ions comprise hydrogen ions or fluorine ions.

4. The processing apparatus of claim 1, wherein the resonance RF power supply is configured to generate the plasma in the plasma chamber.

5. The processing apparatus of claim 1, further comprising a plasma chamber power supply configured to generate the plasma in the plasma chamber.

6. The apparatus of claim 1, wherein the drive frequency is 20 MHz or less.

7. The processing apparatus of claim 1, further comprising:
a process chamber disposed adjacent the plasma chamber and configured to hold a substrate; and
an extraction plate disposed between the plasma chamber and the process chamber, and configured to extract a mass analyzed ion beam from the plasma through an extraction aperture that impacts the substrate, wherein the mass analyzed ion beam comprises a first ratio of second ions to first ions that is higher than a second ratio of second ions to first ions in the plasma.

8. The processing apparatus of claim 1, wherein the resonance RF power supply comprises a first resonance RF power supply, the drive signal comprises a first drive signal having a first drive frequency, and the plasma comprises third ions, the apparatus further comprising:
a second resonance RF power supply configured to generate a second drive signal having a second drive frequency,
wherein the first magnetic field strength imparts a third cyclotron frequency for the third ions that matches the second drive frequency of the second drive signal.

9. The apparatus of claim 7, wherein the magnet assembly is configured to generate a field direction of the magnetic field that is parallel to a plane of the extraction plate.

10. A processing apparatus, comprising:
a plasma chamber configured to house a plasma comprising first ions and second ions;
a heating component to heat the plasma chamber;
a resonance RF power supply to generate a drive signal that is coupled to the plasma chamber, the drive signal having a drive frequency;
a magnet assembly to generate a magnetic field in the plasma chamber,
wherein the magnetic field has a first magnetic field strength that imparts a first cyclotron frequency for the first ions that matches the drive frequency of the drive signal,
wherein the first magnetic field strength imparts a second cyclotron frequency for the second ions that does not match the drive frequency of the drive signal, and
wherein the first ions are selectively driven into a chamber wall of the plasma chamber.

11. The processing apparatus of claim 10, wherein the drive signal generates an ion cyclotron resonance in the first ions that increases a Larmor radius of the first ions, wherein the first ions collide with a chamber wall of the plasma chamber.

12. The processing apparatus of claim 10, further comprising:
a process chamber disposed adjacent the plasma chamber and configured to hold a substrate; and
an extraction plate disposed between the plasma chamber and the process chamber, and configured to extract a mass analyzed ion beam from the plasma through an extraction aperture that impacts the substrate, wherein the mass analyzed ion beam comprises a first ratio of second ions to first ions that is higher than a second ratio of second ions to first ions in the plasma.

13. The processing apparatus of claim 10, wherein the resonance RF power supply is configured to generate the plasma in the plasma chamber.

14. The processing apparatus of claim 10, wherein the resonance RF power supply comprises a first resonance RF power supply, the drive signal comprises a first drive signal having a first drive frequency, and the plasma comprises third ions, the apparatus further comprising:
a second resonance RF power supply configured to generate a second drive signal having a second drive frequency;
wherein the first magnetic field strength imparts a third cyclotron frequency for the third ions that matches the second drive frequency of the second drive signal.

15. The apparatus of claim 10, wherein the plasma is formed from a molecular precursor that contains hydrogen, wherein the heating component is configured to increase fractionation of species produced from the molecular precursor.

16. The processing apparatus of claim 10, wherein the drive frequency is a first drive frequency, the processing apparatus further comprising:
a plasma source to provide input power to generate the plasma; and
a controller coupled to the plasma source, resonance RF power supply and the magnet assembly, the controller configured to increase drive frequency and magnetic field strength in concert from the first drive frequency to a third drive frequency and from the first magnetic field strength to a second magnetic field strength,
wherein the second magnetic field strength imparts a fourth cyclotron frequency for the first ions that matches the third drive frequency of the drive signal, and
wherein, when input power to the plasma is held constant, the first magnetic field strength and first drive frequency impart a first chamber heating that is lower than a second chamber heating imparted by the third drive frequency and second magnetic field strength.

17. A method, comprising:
generating a magnetic field within a plasma chamber containing a plasma comprising first ions and second ions, wherein the magnetic field imparts a first cyclotron frequency to the firsts ions and a second cyclotron frequency to the second ions;
generating a drive signal within the plasma chamber, the drive signal comprising electromagnetic radiation having a drive frequency that matches the first cyclotron frequency and does not match the second cyclotron frequency, wherein the first ions are selectively driven into a chamber wall of the plasma chamber; and extracting a mass analyzed ion beam from the plasma chamber when the drive signal and magnetic field are within the plasma chamber, wherein the mass analyzed ion beam comprises a first ratio of second ions to first ions that is higher than a second ratio of second ions to first ions in the plasma.

18. The method of claim 17, wherein the drive signal comprises a first drive signal having a first drive frequency, and the plasma comprises third ions of a third species, wherein the magnetic field imparts a third cyclotron frequency for the third ions different from the first cyclotron frequency and second cyclotron frequency, the method further comprising:

generating a second drive signal having a second drive frequency in the plasma chamber; wherein the second drive signal matches the third cyclotron frequency.

19. The method of claim 17, further comprising generating the plasma using the drive signal.

20. The method of claim 17, wherein the magnetic field has a first magnetic field strength and the drive frequency is a first drive frequency, the method further comprising:

increasing drive frequency and magnetic field strength in concert from the first drive frequency to a third drive frequency and from the first magnetic field strength to a second magnetic field strength, wherein the second magnetic field strength imparts a fourth cyclotron frequency for the first ions that matches the third drive frequency of the drive signal, wherein, when the first drive frequency and first magnetic field are applied, the first ions have a first resonance duration comprising an elapsed time spent in cyclotron resonance before striking the plasma chamber, and wherein when the third drive frequency and second magnetic field are applied, the first ions have a second resonance duration that is less than the first resonance duration.

* * * * *